United States Patent [19]

Jones

[11] Patent Number: 4,489,481
[45] Date of Patent: Dec. 25, 1984

[54] INSULATOR AND METALLIZATION METHOD FOR VLSI DEVICES WITH ANISOTROPICALLY-ETCHED CONTACT HOLES

[75] Inventor: Gary W. Jones, Sugarland, Tex.

[73] Assignee: Texas Instruments Incorporated, Dallas, Tex.

[21] Appl. No.: 420,153

[22] Filed: Sep. 20, 1982

[51] Int. Cl.³ .......................................... H01L 21/283
[52] U.S. Cl. .................... 29/591; 29/577 C; 357/68; 156/643
[58] Field of Search ...................... 29/571, 577 C, 591; 357/68; 156/643

[56] References Cited

U.S. PATENT DOCUMENTS 4,327,477  5/1982  Yaron et al. ...................... 29/576 B

OTHER PUBLICATIONS

Tsang, P. J., "Method of Forming Poly-Si Pattern with Tapered Edge", in *IBM-T.D.B.*, vol. 19, No. 6, Nov. 1976, pp. 2047–2048.

*Primary Examiner*—Aaron Weisstuch
*Assistant Examiner*—Alan E. Schiavelli
*Attorney, Agent, or Firm*—John G. Graham

[57] ABSTRACT

In manufacture of VLSI semiconductor devices, the insulator surface upon which a metallization pattern is deposited must be smooth to facilitate lithographic operations. This requires the insulator to be thick and flowed or otherwise treated to eliminate steep edges. A contact hole etched in a thick insulator has steep sidewalls, however, and so chemical vapor deposition is preferably used for the metallization so the sidewalls will be coated. A thin insulator coating is deposited after the contact holes are etched and prior to metallization to cover the low-resistance flowed insulator and self-align the contacts.

15 Claims, 11 Drawing Figures

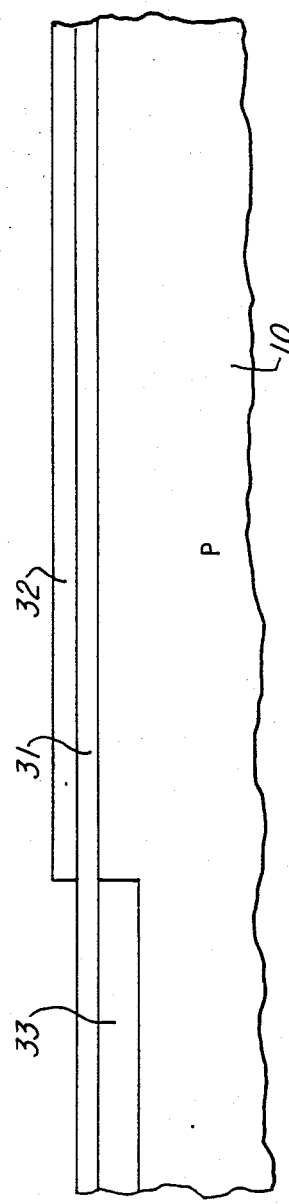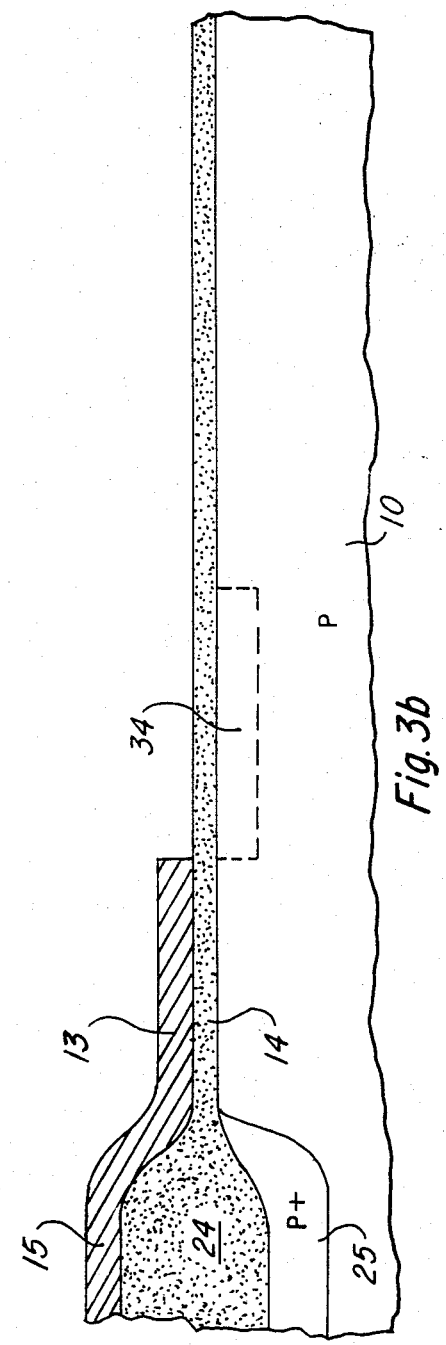

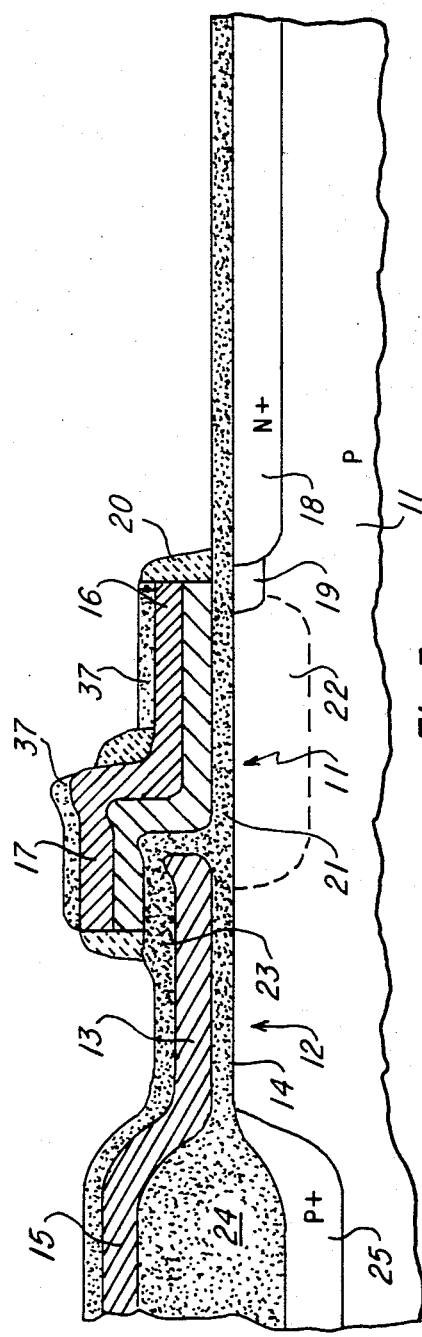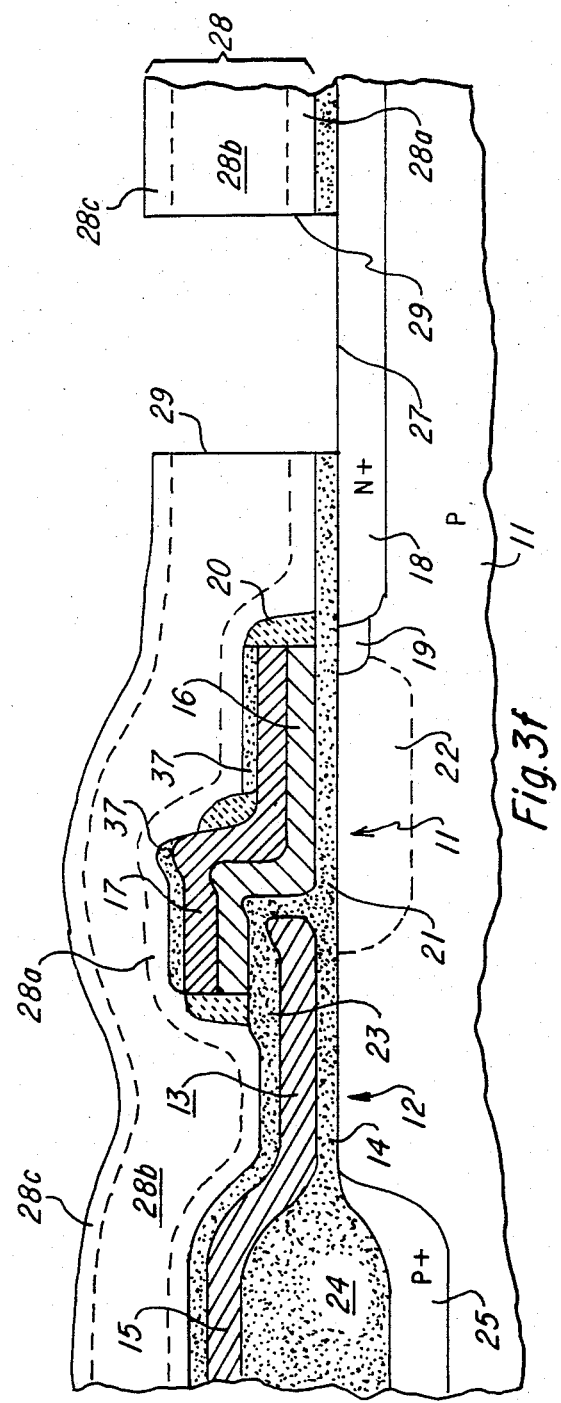
Fig.3e
Fig.3f

INSULATOR AND METALLIZATION METHOD FOR VLSI DEVICES WITH ANISOTROPICALLY-ETCHED CONTACT HOLES

BACKGROUND OF THE INVENTION

This invention relates to semiconductor devices, and more particularly to improved metal contacts and interconnections for semiconductor integrated circuits.

In the past ten years, semiconductor memory devices have increased in density from 4K bit devices designed in 1972 to 256K and 1 megabit devices being designed in 1982, employing semiconductor chips of about the same size. To accomplish this, line resolution has been reduced to about one or two micron or less. In manufacture of these VLSI semiconductor devices, a thin metal coating such as aluminum is deposited and patterned to create contacts and interconnections. Problems occur in thinning of the narrow metal strip at near-vertical steps or sidewalls. Thinner metal at these steps or sidewalls results in higher resistance and a propensity for electromigration failures. Heretofore, the steepness of the sidewalls has been minimized by a "reflow" process performed after the contact holes are opened, but this necessitates undesirable high temperature operations, as well as much larger geometries. Various etching methods have provided sloping sides, but for very high density devices the space occupied by the enlarged contact holes is unacceptable.

It is the principal object of this invention to provide an improved process for making VLSI type semiconductor integrated circuits; particularly for improving metallization coverage and metal-to-silicon contacts. Another object is to provide improved semiconductor devices with conductor or metallization patterns which make contacts through thick insulator coatings and avoid thinning at steps and discontinuities at holes in such coatings. A further object is to provide improved step coverage for metallization of semiconductor devices, without destroying narrow geometries.

SUMMARY OF THE INVENTION

In accordance with one embodiment of the invention, in manufacture of VLSI semiconductor devices, the insulator surface upon which a metallization pattern is deposited must be smooth to facilitate lithographic operations. This requires the insulator to be thick and flowed or otherwise treated to eliminate steep edges. A contract hole etched in a thick insulator has steep sidewalls, however, and so chemical vapor deposition is preferrably used for the metallization so the sidewalls will be coated. A thin insulator coating is deposited after the contact holes are etched and prior to metallization to cover the low-resistance flowed insulator and self-align the contacts; this coating allows the opening in the mask for photolithographic contact printing to be larger (up to one micron) than the actual contact, i.e., the mask constraints are relaxed yet the geometry remains small enough for extremely high circuit density. Both the planar surface and the larger hole sizes facilitate photolithographic processes.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIGS. 3a–3f are elevation views in section of the part of the chip corresponding to FIG. 1 at successive stages in manufacture.

DETAILED DESCRIPTION OF SPECIFIC EMBODIMENT

Figure 1:
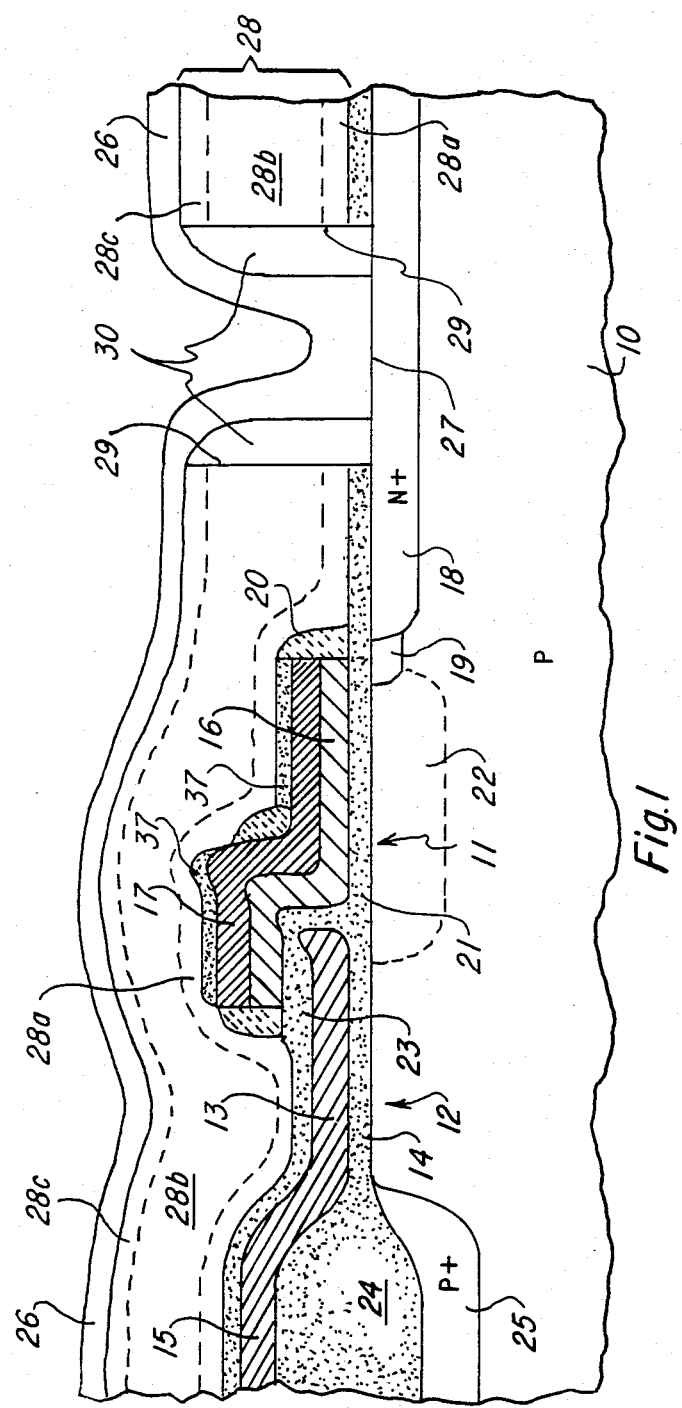
FIG. 1 is a greatly enlarged elevation view in section of a small part of a semiconductor chip made according to the invention.
Figure 2:
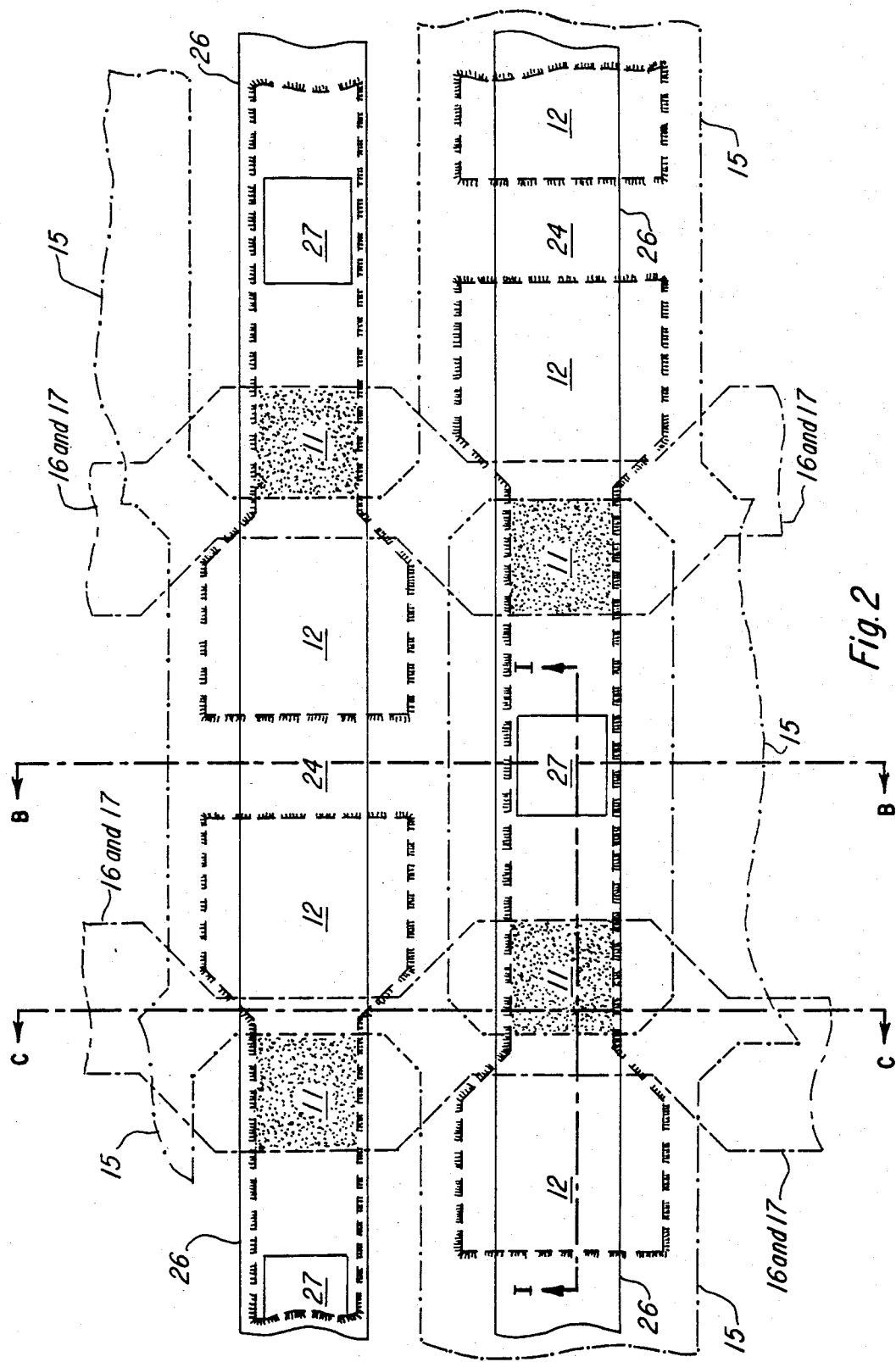
FIG. 2 is a plan view of the part of the chip of FIG. 1.
Figure 2A:
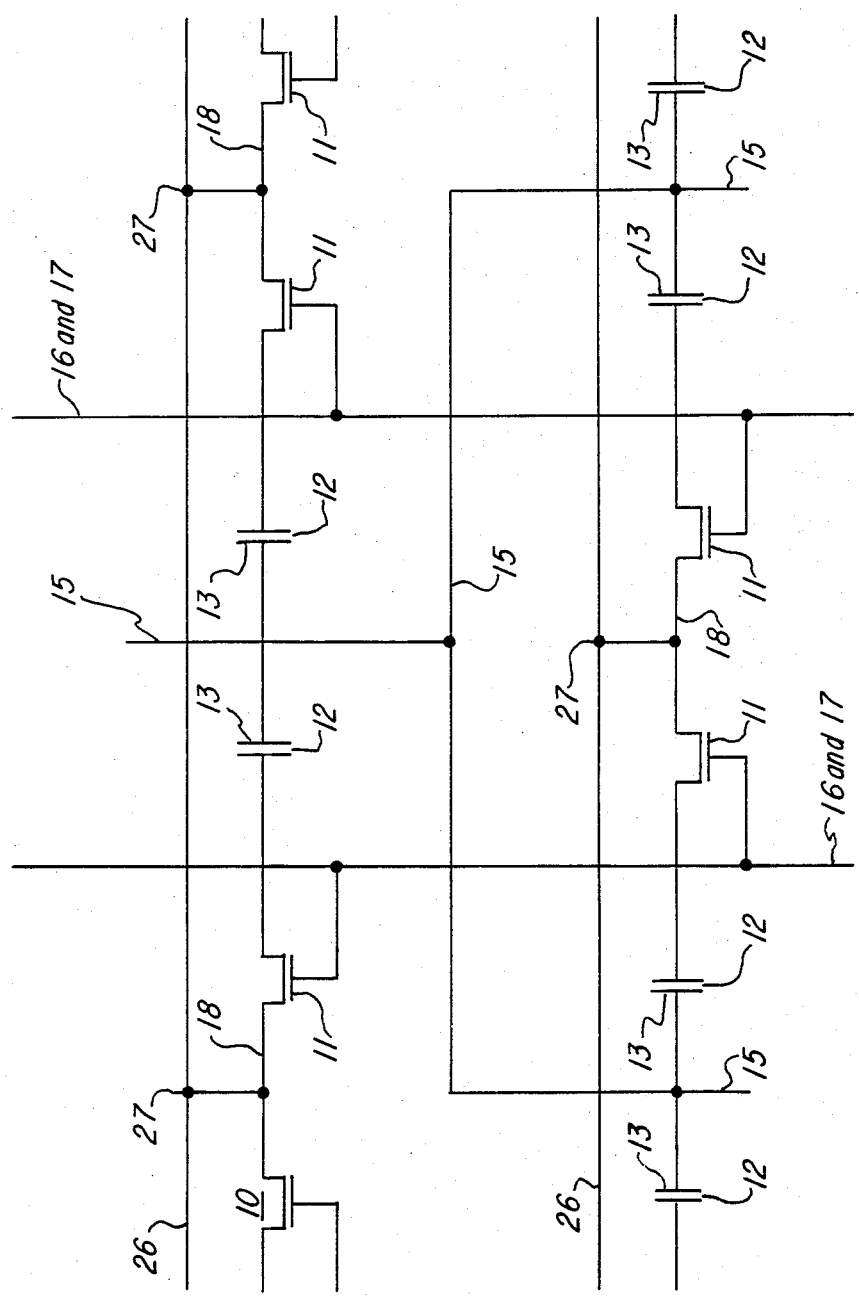
FIG. 2a is an electrical schematic diagram of the part of the cell array of FIG. 2.
Figure 2B:
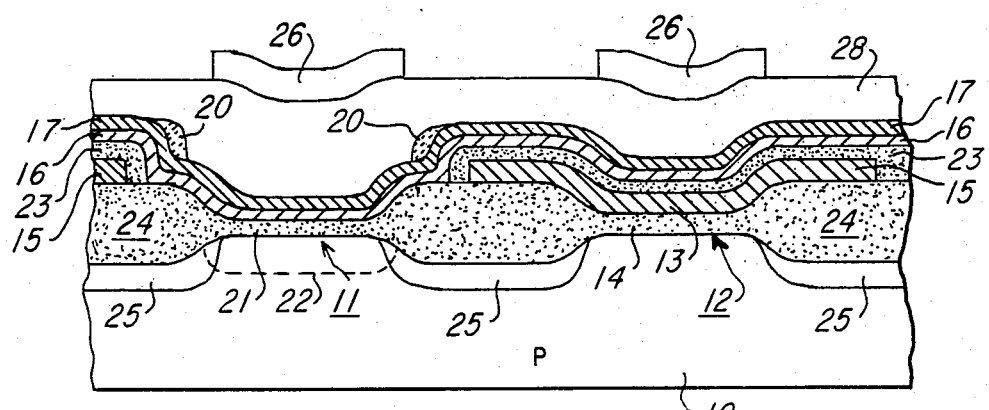
FIGS. 2b and 2c are elevation views in section of the device of FIGS. 1 and 2, taken along the lines b—b and c—c of FIG. 2.
Figure 2C:
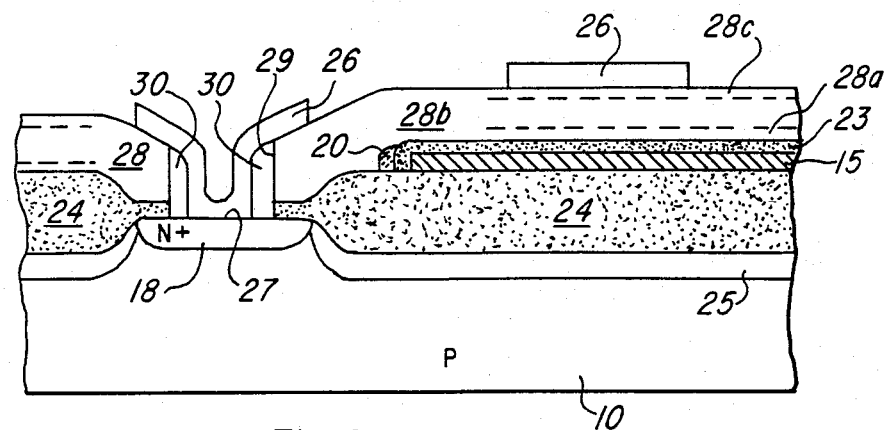

Referring to FIGS. 1 and 2, an array of one-transistor dynamic memory cells is shown as an example of a semiconductor device which may use the insulator and metallization process of the invention. A silicon substrate 10 has a transistor 11 and a capacitor 12 formed in one face. The capacitor 12 is created by a first-level polysilicon plate 13 separated from the face by a silicon oxide dielectric 14. The plate 13 is part of a web-like sheet 15 of first-level polysilicon which covers the face except for holes where the transistors are positioned, and this sheet 15 is connected to a supply voltage Vdd of +5V to create a lower plate for the capacitor, and also to create end of the source-to-drain path of the transistor 11, by inverting the surface of the silicon beneath the dielectric 14. The transistor 11 consists of a second-level polysilicon gate 16 and this gate is covered by a molybdenum silicide layer 17 to lower the resistance of the row line which forms the gates for all of the transistors in a row of like cells. The source/drain on one side of the transistor 11 is an N+ region 18 with a more lightly doped N− region 19 to bridge the gap beneath a sidewall oxide spacer 20. The gate 16 is separated from its underlying channel by a thin gate insulator 21, and the channel is implanted with P type impurity in a region 22 to set the threshold to the proper level. The gate 16 is separated from the first-level poly 13 by a thermal oxide layer 23 grown at the same time as gate oxide 21. Thick thermally-grown field oxide 24 surrounds the capacitor and transistor on the face of the clip 10 and P+ channel stop regions 25 underlie all of the field oxide. A metal strip 26 extends along the face to make contact to the N+ regions 18 for each adjacent pair of cells at a contact area 27, creating a "bit" line or column line. A thick layer 28 of silcon oxide or other insulator as described below deposited at low temperature serves to insulate the metal level from the poly layers, and an aperture 29 in this layer has steep sidewalls necessary to preserve in the geometric integrity. This steep discontinuity would cause thinning of the metal 26 if evaporated or sputtered metal was used, so CVD metallization is employed to coat the sidewalls.

According to the invention, a layer 30 of a deposited insulator is applied after the hole 29 is etched but prior to the metal deposition and functions to aid in defining the size of the contact 27, as well as to coat the edges of the hole to avoid shorts or leakage. The low temperature application of the layer 30 allows for better control of the channel lengths of the transistor 11 and avoids disturbing the siliciding. Phosphorous, which causes metal corrosion, is sealed from the metal 26 by the undoped oxide along the top surface of the oxide 28 and by the oxide 30 at the edges of hole 29, yet phosphorous in the layer 28 provides good metal ion migration protection. The upper part of the multilevel oxide 28 can be plasma-deposited undoped oxide, rather than phosphorous-doped glaze, and this is advantageous because it is a better insulator and exhibits a lower defect density. The planar upper surface of the flowed coating 28, however, prevents sharp steps which would result in metal filaments after etch of a CVD metal.

Figure 3C:
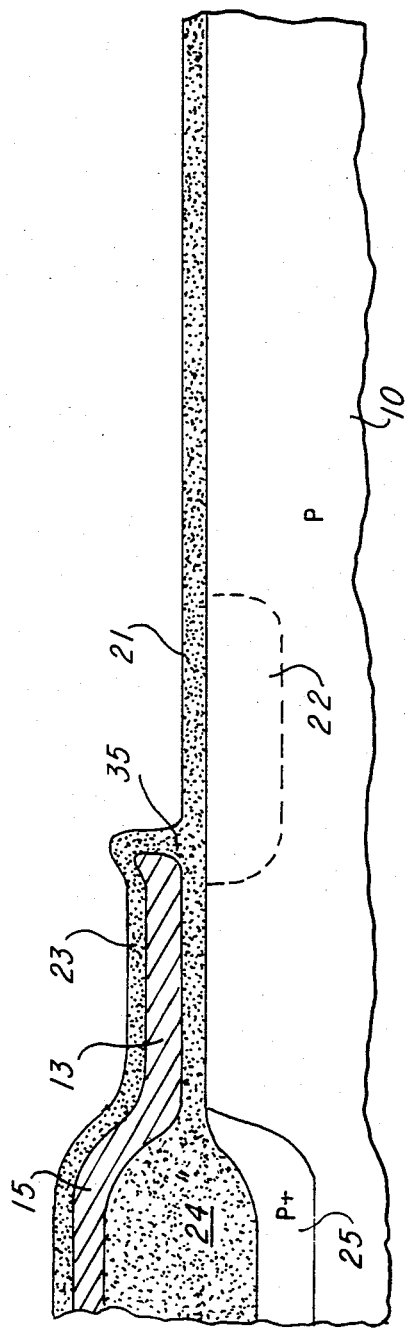

Turning now to FIGS. 3a–3f, a process for making a semiconductor device such as a dynamic RAM cell array using an insulator and metallization process according to the invention will be described. The starting material is a slice of P-type monocrystalline silicon, typically about four inches in diameter, cut on the <100> plane, of suitable resistivity. The slice may be P-epitaxial material on a P+ substrate. In the Figures the portion shown of the bar 10 represents only a very small part of one bar, less than one mil wide, and each slice contains hundreds of bars. After appropriate cleaning, the slice is oxidized by exposing to oxygen in a furnace at an elevated temperature of over 1000° C. to produce an oxide layer 31 over the entire slice of a thickness of about 400 Å, as seen in FIG. 3a. Next, a layer 32 of silicon nitride of about 1000 Å or more in thickness is formed over the entire slice by exposing to a atmosphere of dichlorosilane and ammonia in a reactor. A coating of photoresist is applied to the entire top surface of the slice, then exposed to ultraviolet light through a mask which defines the desired pattern of the thick field oxide 24 and the P+ channel stops 25. The resist is developed, leaving areas where nitride is then removed by etching the exposed part of the nitride layer 32 but leaving in place the oxide layer 31.

Using photoresist and nitride as a mask, the slice is subjected to an implant step to produce the channel stop regions; to this end boron atoms are introduced by ion implant into unmasked regions 33 of silicon. The regions 33 will not exist in the same form in the finished device, because silicon will be consumed in the field oxidation procedure. Usually the slice is subjected to a heat treatment after the boron implant but prior to field oxide growth, as set forth in U.S. Pat. No. 4,055,444 issued to G. R. Mohan Rao, assigned to Texas Instruments.

The next step in the process is the formation of field oxide 24 by subjecting the slices to steam or an oxidizing atmosphere at about 1000° C. for several hours. This causes a thick field oxide layer 24 to be grown as seen in FIG. 3b, extending into the silicon surface as silicon is consumed upon oxidation. The remaining parts of the nitride layer 32 mask oxidation. The thickness of this layer 24 is about 10,000 Å, part of which is above the original surface and part below. The boron doped P+ regions 33 formed by implant are partly consumed, but also diffuse further into the silicon ahead of the oxidation front to produce P+ field stop regions 25 which are much deeper than the original regions 33.

Next the remaining nitride layer 32 is removed by an etchant which attacks nitride but not silicon oxide, then the oxide 31 is removed by etching and the exposed silicon cleaned. The silicon oxide 14 used for the capacitor dielectric is grown by thermal oxidation to a thickness of about 200 to 400 Å.

As seen in FIG. 3b, a first layer 15 of polycrystalline silicon is deposited over the entire slice in a reactor using standard techniques to a thickness of about 5000 Å. This layer is doped with phosphorus by an N+ deposition to make it highly conductive. This first level polysilicon layer is patterned by applying a layer of photoresist, exposing to ultraviolet light through a mask prepared for this purpose, developing, then etching the exposed polysilicon to define the capacitor gates 13 and strips 15 in the cell array. The threshold voltages of the enhancement mode transistors in the cell array or in the periphery of the chip are adjusted by a masked ion implant; boron is implanted at a relatively low dosage in the area 34, using a photoresist mask, then driven in by subsequent heat treatment to create the region 22.

Referring to FIG. 3c, the exposed oxide 14 is removed, and the upper surface of the first level polysilicon 13 and 15 as well as exposed silicon is oxidized by exposing the slice to an oxidizing atmosphere at 900 to 1000° C. to create the second thin thermal oxide layer 21 over the channel of the transistor 11 and the thicker layer 23 over the capacitor gate 13 and 15. This oxide has a thickness of about 400 Å over the silicon surface but grows thicker over polysilicon 13 and 15; also it is noted that the oxide will be thicker under the edge of the gate 15 at the area 35 due to oxygen diffusion beneath the edge and oxidation of the underside.

Figure 3D:
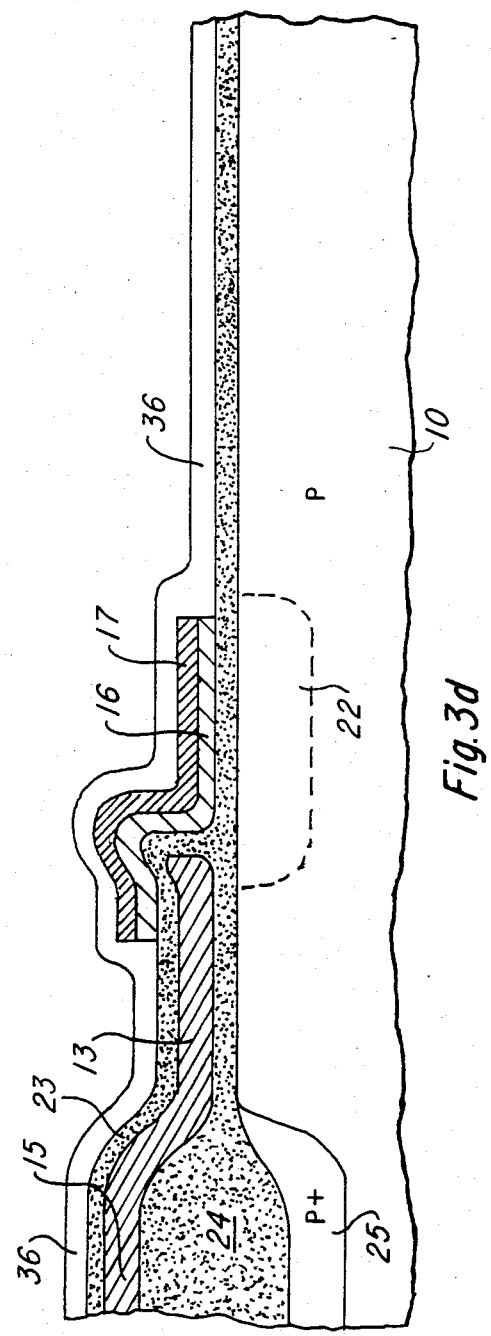

Referring to FIG. 3d, a second level of polycrystalline silicon 16 is next deposited over the slice using standard techniques, to a thickness of about 2500 Å, and then a layer 17 of molybdenum silicide is deposited on top of the second level poly, also to a thickness of about 2500 Å. These layers are masked by photoresist and etched to leave the segments which form the transistor gates 16, 17.

To create the sidewall spacer 20, a layer 36 of silicon oxide is now deposited over the entire slice as seen in FIG. 3d, and then subjected to anisotropic etch to remove this oxide on all horizontal surfaces, leaving the sidewall oxide 20 at all vertical or steep surfaces. The oxide 23 is thinned where not covered by the second-level poly, and thermal oxide 21 is removed by the etch so it is regrown with the oxide 37.

Referring to FIG. 3e, the arsenic implant is performed at a dosage in the order of $10^{16}$ ions/cm$^2$, masked by the polysilicon gates 13 and 16, as well as by the sidewall oxide 20, to produce the source/drain N+ region 18. A lower-dosage phosphorous implant, about $10^{14}$, is then performed to create the reach-through region 19 and provide a lightly-doped graded-junction drain-to channel interface for the reasons set forth in pending U.S. Pat. application Ser. No. 412,753, filed Aug. 30, 1982, for Smayling and Duane or application Ser. No. 418,897, filed Sept. 16, 1982, by James M. McDavid, both assigned to Texas Instruments, and in the Journal of Solid-State Circuits, April 1982, p. 200. A heat treatment drives in these implants. The exposed moly silicide is thermally oxidized prioor to the implants, producing a layer 37 to prevent outdiffusion of impurities which would enter the region 18, and to prevent build-up of charge by the implant, which could cause failures in the thin oxide 21.

Referring to FIG. 3f, a thick layer 28 of insulator is next deposited by a one of several alternative methods. This layer 28 insulates the metal level from the layers of polycrystalline silicon, and is referred to as multilevel oxide. One example is to first apply a layer 28a of SiO$_2$ by a plasma deposition process, although this layer may not be needed if sufficient oxide is present from previous thermal oxidation or depositions to control leakage between various electrodes on the substrate. The thickness of the layer 28a is about 2.5KÅ. A polymer insulator layer 28b is then applied as a liquid and spun on to produce a thickness of 5–10KÅ, then baked. The composition of the layer 28b is polymide, for example, or alternatively a phosphosilicate glaze (7 to 12% phosphorus) could be deposited then reflowed to smooth the surface. Next a layer 28c of SiO$_2$ is deposited by a plasma deposition to a thickness of 6–10KÅ. The total thickness of the layer 28 is thus about 15–25KÅ, i.e., thicker than the usual multilevel oxide, and the purpose of this is to provide a planar surface for the metallization.

The thick oxide 28 is patterned by a photoresist etch operation to open the hole 29 and expose the contact area 27 for metal-to-silicon contact along the bit line 26 in the cell array (and contact areas for a metal-to-silicon or metal-to-poly contact for peripheral devices. This is, an anisotropic dry etch such as a reactive ion etch, or plasma etch as in U.S. Pat. No. 4,291,162, performed to create the hole 29, is which produces nearly vertical sidewalls to expose the contact area 27 but yet the geometry is preserved.

According to the invention, the oxide coating 30 is deposited by a plasma deposition process (after removal of photoresist), then an anisotropic etch (reactive ion or plasma) removes the oxide 30 along the top face and in the contact area 27 but not on the sidewalls of the hole 29. Note that the resulting exposed silicon area 27 is substantially smaller than the size of hole 29; that is, a small contact area (one micron square) can be obtained with a mask hole much larger (1.5 to 2 microns on a side).

The metal contacts and interconnections are then made by depositing a thin film of tantalum, or aluminum or silicon-doped aluminum, for example, over the entire top surface of the slice by a chemical vapor deposition porcess as described in Solid State Technology, December 1980, pp. 79–82, or in the IEEE ISSCC 1982, p. 234, for example, which will coat the sidewalls. The conventional deposition methods for metallization, such as evaporation or sputtering, are directional and leave thinned sidewalls, so CVD is an important feature of the process. The metal is then patterned by a photoresist mask and etch sequence, leaving the metal strips 26.

Alternatively, an anisotropic etch can be performed as in application Ser. No. 410,755, filed Aug. 23, 1982, by James M. McDavid, assigned to Texas Instruments, to leave sidewall metal segments, and then another metal deposition produces double-thick sidewalls of metal for the hole 29. The planar surface of the oxide 28 prevents unwanted metal filaments when this is done.

A thick protective oxide layer (not shown) covers the metallization, with apertures etched in this layer above bonding pads. This layer is non-thermal oxide, deposited at low temperature in accord with standard MOS manufacturing methods, and usually covers everything except the bonding pads on a bar.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A method of making a semiconductor device comprising the steps of
   (a) forming circuit elements on a face of semiconductor body, edges of the circuit elements exhibiting steep sides,
   (b) applying a thick coating of an insulator material to said face and flowing the insulator material to thereby reduce the severity of discontinuities along the face and provide a smooth surface,
   (c) opening a hole in said thick coating by an anisotropic etch which leaves steep sidewalls,
   (d) coating said face with an insulator layer much thinner than said thick coating using an isotropic deposition which coats the steep sidewalls of said hole, and subjecting said insulator layer to an anisotropic etch to remove the insulator layer except at said sidewalls to thereby open a contact hole, and
   (e) thereafter applying a metal strip on said face by first depositing a coating of metal by an isotropic deposition which avoids thinning of the metal at said sidewalls of the hole, and then patterning the coating of metal to leave said metal strip extending down said sidewalls to engage the semiconductor body at said contact hole.

2. A method according to claim 1 wherein the semiconductor body is silicon and the insulator layer is silicon oxide.

3. A method according to claim 1 wherein said thick coating of insulator material includes silicon oxide.

4. A method according to claim 3 wherein the thick coating of insulator material includes silicon oxide containing phosphorous, and said insulator layer does not contain phosphorous.

5. A method according to claim 1 wherein the step of opening a contact hole in said thick coating is a dry etch to produce vertical walls for the hole.

6. A method according to claim 1 wherein the thick coating includes a layer of a polymer insulator and an overlying layer of silicon oxide.

7. A method according to claim 1 wherein the thick coating includes phosphorus-doped oxide flowed by a high temperature operation.

8. A method according to claim 1 wherein the thick coating includes a polymer flowed upon applying.

9. A method of reducing surface discontinuities and preserving geometric integrity in manufacture of VLSI type semiconductor devices comprising the steps of
   (a) forming layers of circuitry-defining materials on a face of a semiconductor body, edges of the layers exhibiting steep sides,
   (b) applying a thick coating of multilayer insulator material on said face and flowing the thick coating to thereby provide a smooth surface above the face, and
   (c) opening a hole in said thick coating by an anisotropic etch which leaves steep sidewalls,
   (d) coating said face with an insulator layer much thinner than said thick coating using an isotropic deposition which coats the steep sidewalls of said hold, and subjecting said insulator layer to an anisotropic etch to remove the insulator layer except at said sidewalls to leave a contact hole, and
   (e) thereafter applying a metal strip on said face by first depositing a coating of metal by an isotropic deposition which avoids thinning of the metal at said sidewalls, and then patterning the coating of metal to leave said strip extending down said sidewalls to said contact hole.

10. A method according to claim 9 wherein the semiconductor body is silicon and the thick coating of insulator material includes a layer of phosphorus-doped silicon oxide flowed by high temperature.

11. A method according to claim 9 wherein said thick coating includes a first coating of silicon oxide applied over said circuitry-defining materials, a second coating of flowable insulator material, and a third coating of silicon oxide beneath the conductive strips.

12. A method according to claim 11 wherein the flowable insulator material is silicon oxide with a percentage of phosphorous, and said thinner insulator layer does not contain phosphorus.

13. A method according to claim 12 wherein the step of opening said hole in said thick coating is an ansiotropic etch to produce vertical walls for the hole.

14. A method of making a contact at a face of a semiconductor body, comprising the steps of:

covering said face with a first coating of insulator;

opening a hole in said first coating by an anisotropic etch which leaves steep sidewalls;

applying a second coating of insulator to said face by an isotropic deposition which coats said sidewalls;

subjecting said face to an anisotropic etch to leave the second coating at said sidewalls but remove the second coating at a contact area in said hole, applying a conductive strip by coating said face with a conductive material then patterning the conductive material to leave said strip extending down said sidewalls to engage said contract area in said hole.

15. A method according to claim 14 including the step of flowing the first coating to thereby reduce the severity of discontinuities along the face and provide a relatively smooth surface.

* * * * *